United States Patent [19]

Ogawa et al.

[11] Patent Number: 5,412,258
[45] Date of Patent: May 2, 1995

[54] INTEGRATED CIRCUIT TESTING DEVICE

[75] Inventors: Yoshikazu Ogawa, Yokohama; Kazuhiko Ohashi, Tokyo, both of Japan

[73] Assignee: Kabushiki Kaisha Toshiba, Kawasaki, Japan

[21] Appl. No.: 796,585

[22] Filed: Nov. 22, 1991

[30] Foreign Application Priority Data

Nov. 27, 1990 [JP] Japan .................. 2-320945

[51] Int. Cl.$^6$ ............ H03K 3/01; H03K 5/13; H03L 5/00; G01R 31/28
[52] U.S. Cl. ...................... 327/170; 371/27; 327/1; 327/306; 327/108; 327/538
[58] Field of Search .................. 307/296.1, 296.6, 590, 307/597, 601, 603, 605, 270, 263, 264; 328/34; 371/22.1, 68.3, 27

[56] References Cited

U.S. PATENT DOCUMENTS 4,812,677 3/1989 Perry .................. 307/296.1
4,882,506 11/1989 Johansson et al. ........... 307/296.6
4,907,230 3/1990 Heller et al. .............. 371/68.3
5,095,226 3/1992 Tani ..................... 307/296.6

Primary Examiner—Timothy P. Callahan
Assistant Examiner—Trong Phan
Attorney, Agent, or Firm—Foley & Lardner

[57] ABSTRACT

An integrated circuit testing device, including a small test signal generator for generating a small test signal having a small amplitude corresponding to a test signal supplied to an input terminal of a target integrated circuit to be tested; a test signal supply circuit for amplifying the small test signal generated from the small test signal generator to obtain the test signal having a predetermined power and timing, and for supplying the test signal to the input terminal of the target integrated circuit to be tested; and a controller for setting a rise time of the test signal and a fall time of the test signal at a predetermined time by adjusting the amount of power of the test signal supplied from the test signal supply circuit.

4 Claims, 5 Drawing Sheets

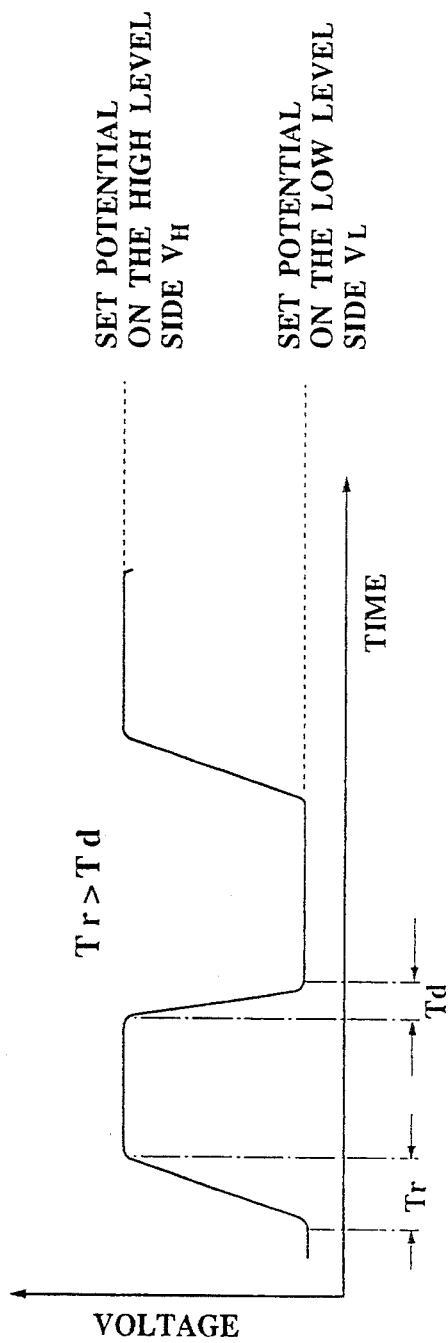
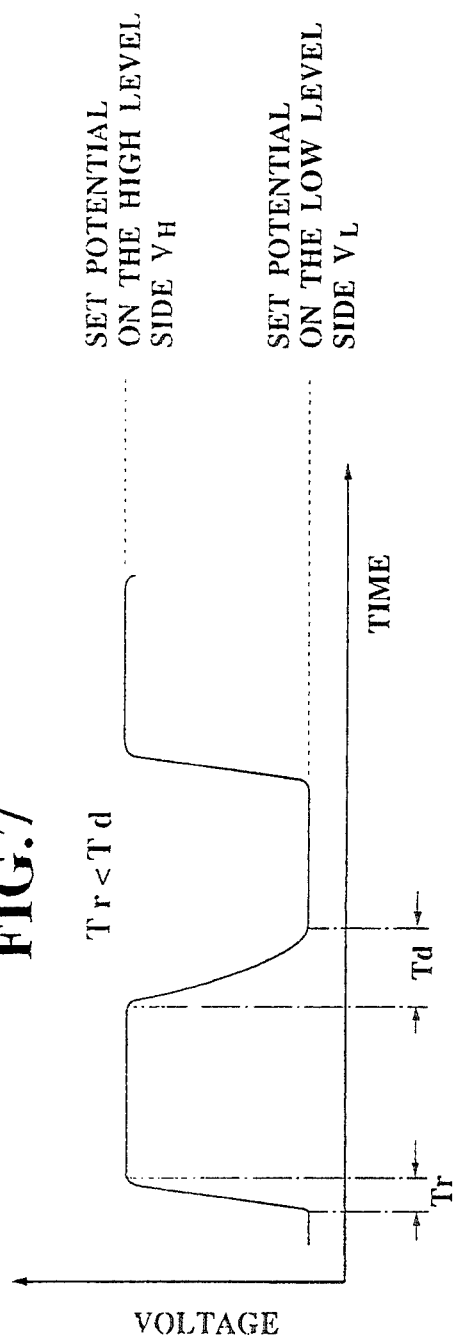

INTEGRATED CIRCUIT TESTING DEVICE

BACKGROUND OF THE INVENTION

1. Field of the Invention

The present invention relates to an integrated circuit testing device for testing digital integrated circuits, and, in particular, to an integrated circuit testing device with improved testing capabilities.

2. Description of the Prior Art

An example of an integrated circuit testing device which tests the operation of a digital circuit as a DUT (Device Under Test) is an unit with the configuration shown in FIG.1.

The integrated circuit testing device shown in FIG.1 comprises a waveform formatter 1 as a small test signal generation means and a power amplification circuit 2.

The waveform formatter 1 inputs an input test pattern represented as logic "1" or logic "0", and timing data which shows the timing of the changes between high level power and low level power of a test signal which is provided to a DUT 3.

The waveform of the input test pattern is then shaped into a small test signal at low power corresponding to a test signal using the timing data. The waveform-shaped small test signal is provided from the waveform formatter 1 to a driver 4, which is an element of the power amplifier circuit 2.

The power amplifier circuit 2 comprises the driver 4, a high power source 5 for high level signal amplification, and a low power source 6 used for low level signal amplification. The power amplifier circuit 2 amplifies the power of the small test signal produced in the waveform formatter 1. Specifically, in the case of a small test signal 20 at high level, the power set by a high level setting signal 22 which sets the high level side of a test signal 21 is supplied to the driver 4 from the high power source 5 for high level signal amplification. In addition, in the case of a small test signal 20 at low level, the power set by a low level setting signal 23 which sets the low level side of a test signal 21 is supplied to the driver 4 from the low power source 6 for low level signal amplification. This power is used to amplify the power of the small, low-powered test signal 20 to provide a test signal with a set level. The power-amplified test signal is supplied from the driver 4 to an input pin of the DUT 3. Based on this test signal, the test results of the DUT 3 which is being operated are provided to a comparator (not shown) or the like and the action of the DUT 3 is judged as good or unsatisfactory.

In this manner, the test signal 21 supplied to a DUT from a conventional integrated circuit testing device is stipulated only by the timing data and the high level and low level setting signals 22, 23.

However, when a CMOS circuit is tested, the rise and fall of the input signal are at a medium potential so that a window-type current or a through-type current flows in the circuit.

Accordingly, in order to evaluate and test a condition of this type consideration must be given to the rise and fall times of the test signal 21.

Also, because the more recent integrated circuits operate at high speeds, the rise and fall times of the signals input to these integrated circuits have become shorter. Accordingly, to correctly evaluate and test these integrated circuits, it is absolutely necessary to include the rise and fall times in the items which are measured.

However, in a conventional integrated circuit testing device, as outlined above, the rise and fall times of the test signals cannot be varied.

Accordingly, it is not possible to take the rise and fall times of the test signal 21 of the DUT 3 into account when evaluating the integrated circuit. This is a problem.

SUMMARY OF THE INVENTION

An object of the present invention is to provide, with due consideration to the drawbacks of such conventional devices, a high capacity integrated circuit testing device which can be used to test the operation of a high speed CMOS circuit in which the evaluation and testing are performed in accordance with the rise and fall times of a test signal provided to a DUT.

An integrated circuit testing device as a preferred embodiment according to the present invention, comprises:

a small test signal generation means for generating a small test signal having a small amplitude corresponding to a test signal supplied to an input terminal of a target integrated circuit to be tested;

a test signal supplying means for amplifying the small test signal generated from the small test signal generation means to obtain the test signal having a predetermined power and timing, and for supplying the test signal to the input terminal of the target integrated circuit to be tested; and a control means for setting a rise time of the test signal and a fall time of the test signal at a predetermined time by adjusting the amount of power of the test signal supplied from the test signal supplying means.

The configuration of main elements of the integrated circuit testing device described above are following:

The test signal supplying means comprises a high power source, a low power source, a driver, a first adjustment load means, and a second adjustment load means, the control means comprises a first adjustment signal generator for generating the first adjustment signal and a second adjustment signal generator for generating the second adjustment signal, the first adjustment load means receives a first adjustment signal, then adjusts the rise time of the test signal by adjusting the amount of the power provided from the high power source in accordance with the first adjustment signal, the second adjustment load means receives a second adjustment signal, then adjusts the fall time of the test signal by adjusting the amount of the power provided from the low power source in accordance with the second adjustment signal, and the driver outputs the test signal corresponding to the small test signal to the input terminal of the target integrated circuit to be tested.

These and other objects, feature and advantages of the present invention will be more apparent from the following description of a preferred embodiment, taken in conjunction with the accompanying drawings.

BRIEF DESCRIPTION OF THE DRAWINGS

FIG. 6 shows a test signal which is set so that the relationship between the rise time Tr and the fall time Td is Tr>Td. Specifically, the rise time Tr is longer than the fall time Td in the Integrated circuit testing device shown in FIGS. 2 and 3; and FIG. 7 shows a test signal which is set so that the relationship between the rise time Tr and the fall time Td is Tr<Td in the integrated circuit testing device shown in FIGS. 2 and 3.

DETAILED DESCRIPTION OF THE PREFERRED EMBODIMENTS

Other features of this invention will become apparent in the course of the following description of an exemplary embodiment which is given for illustration of the invention and is not intended to be limiting thereof.

An embodiment of the present invention is now explained with reference to the drawings.

Figure 2:
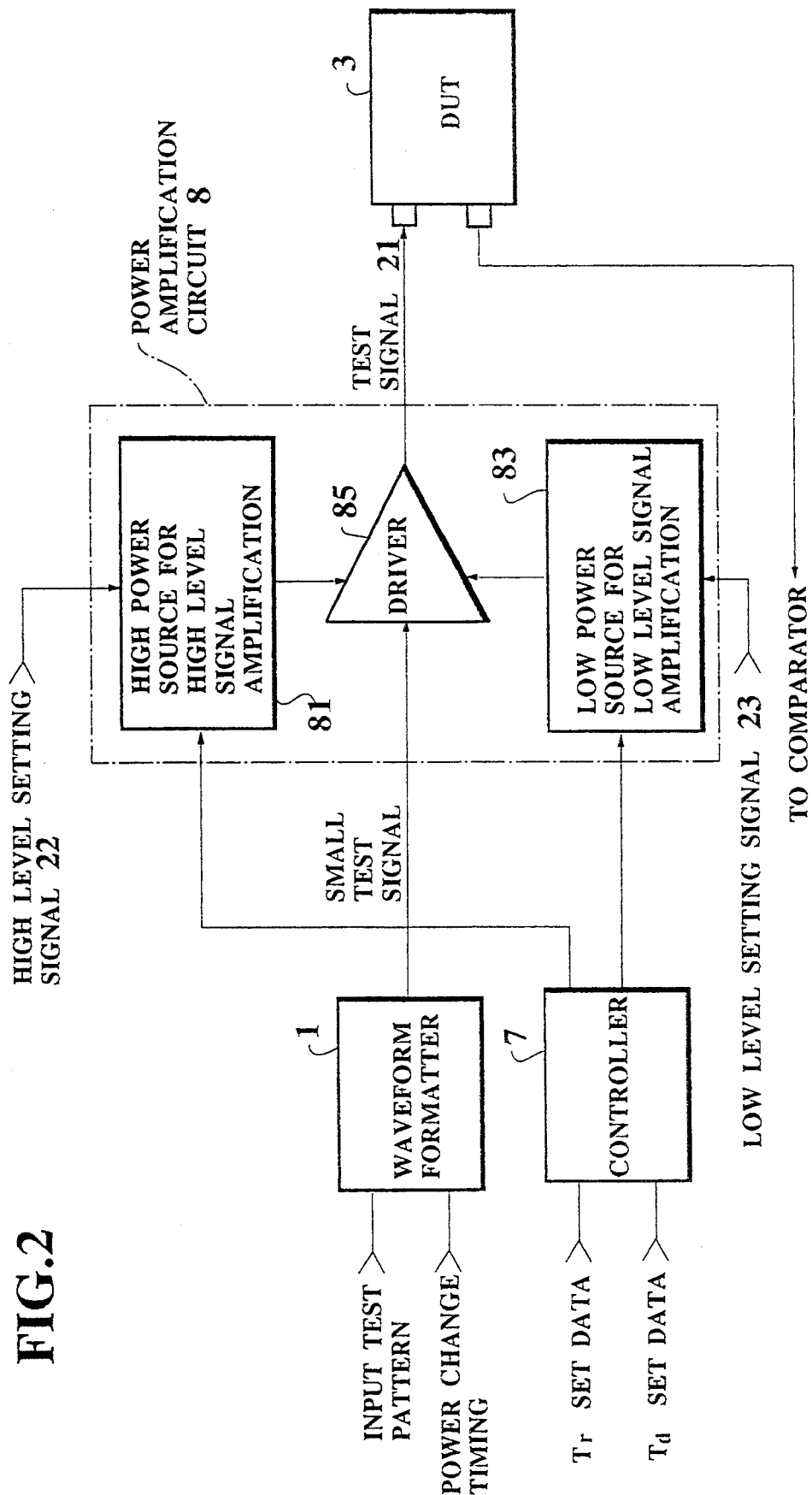
FIG. 2 is a view of the configuration of the main parts of an integrated circuit testing device relating to an embodiment of the present invention.

FIG. 2 is a view of the configuration of the main parts of an integrated circuit testing device relating to an embodiment of the present invention.

Figure 3:
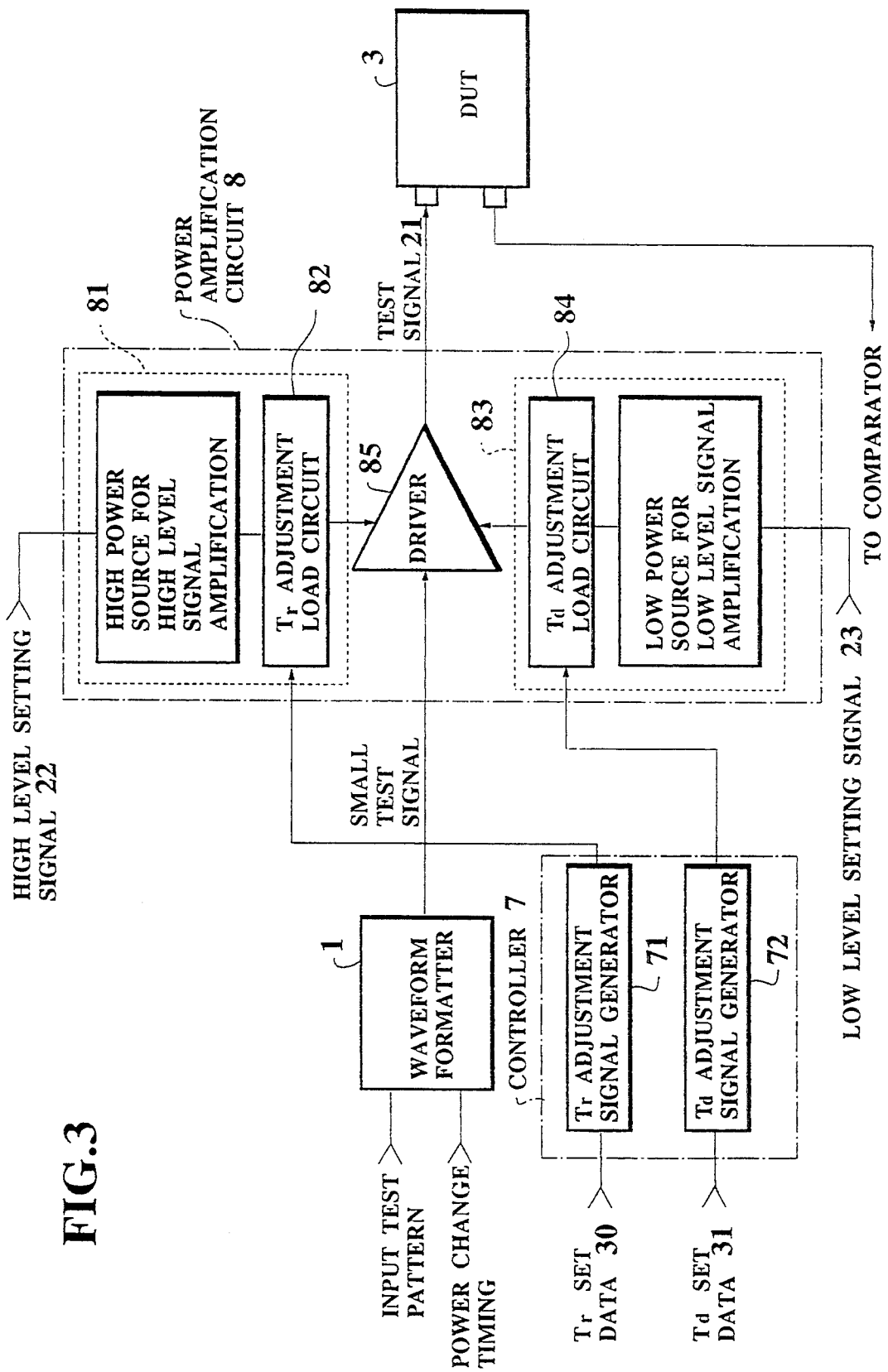
FIG. 3 is a detailed view of the configuration of the integrated circuit testing device shown in FIG. 2.

FIG. 3 is a detailed view of the configuration of the integrated circuit testing device shown in FIG. 2.

Figure 1:
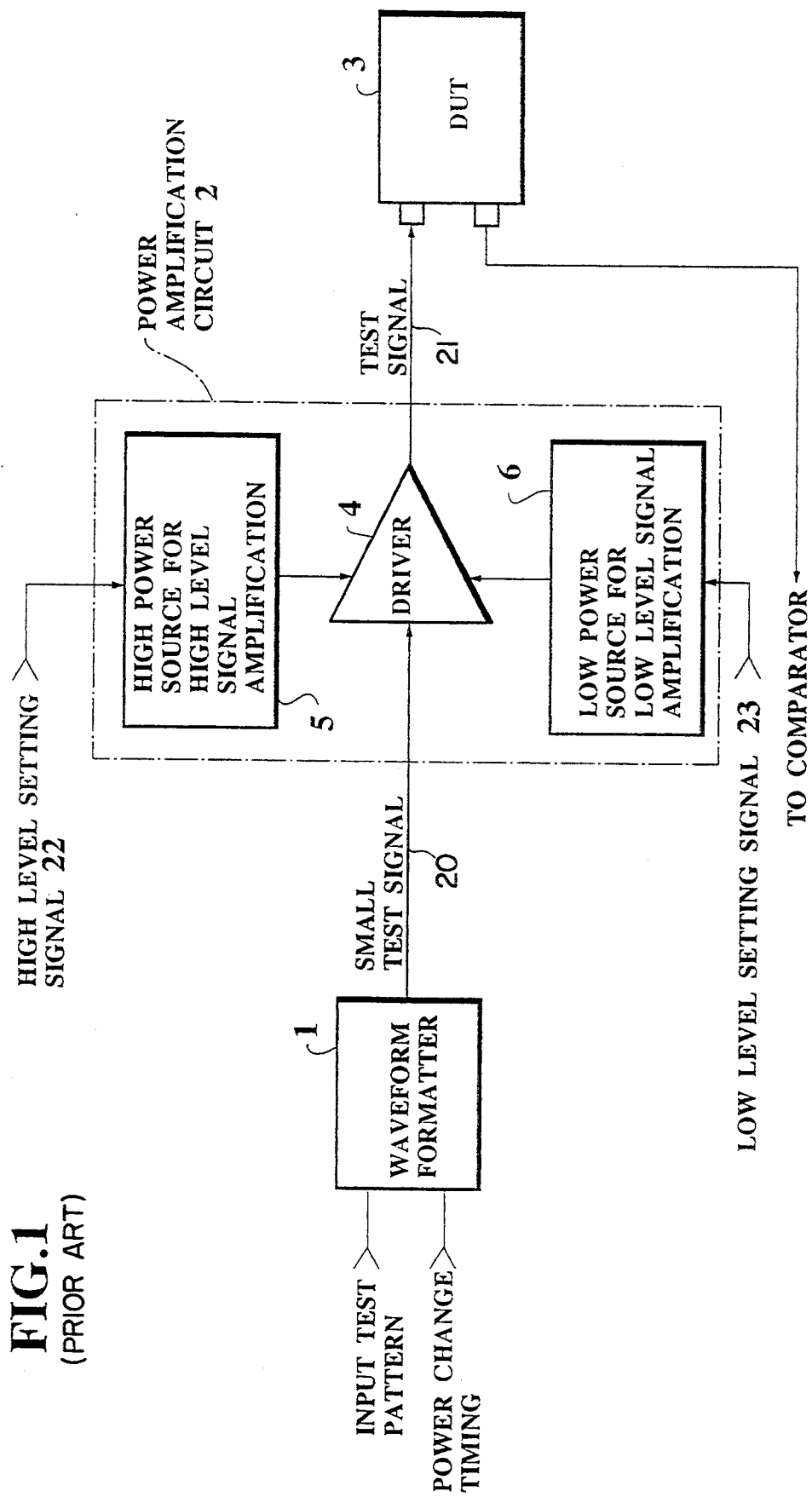
FIG. 1 is a block diagram showing a configuration of a conventional integrated circuit testing device.

The reference numerals used in FIG.1 are also used to designate identical or corresponding parts in FIGS. 2 and 3. Further explanation of these parts is therefore omitted.

The integrated circuit testing device of FIG. 2 has the same configuration as the conventional integrated circuit testing device of FIG. 1, to which a control device 7 as a control means and an improved power amplifier circuit 8 as a test signal supplying means instead of the power amplifier circuit 2 in the conventional integrated circuit testing device shown in FIG. 1 are added.

A high power source 81 for amplification of a high level signal and a low power source 83 for amplification of a low level signal are controlled by the control device 7.

As shown in FIG. 8, the control device 7 comprises a Tr adjustment signal generator 71 as a first adjustment signal generator for adjusting Tr set data 80 and a Td adjustment signal generator 72 as a second adjustment signal generator for adjusting Td set data 81.

The power amplifier circuit 8 comprises a high power source 81 for high level signal amplification, a low power source 83 for low level signal amplification, a driver 85 for supplying a test signal to the DUT 8, a Tr adjustment load circuit 82 as a first adjustment load means for adjusting the high level signal provided from the high power source 81, and a Td adjustment load circuit 84 as a second adjustment load circuit for adjusting the low level signal provided from the low power source 83.

The levels of the high level signal and the low level signal are controlled in accordance with the Tr adjustment signal generated by the Tr adjustment signal generator 71 and the Td adjustment signal generated by the Td adjustment signal generator 72, respectively.

The Tr set data 30 and the Td set data 31, for example, are provided from an external circuit (not shown).

The control device 7 inputs the Tr set data 30 for setting a rise time Tr, and Td set data 31 for setting a fall time Td, for the test signal 21 which is input to the DUT 3 which is the circuit being tested. The control of the high power source 81 and the low power source 83 and, in addition, the control and setting of the rise and fall times of the test signal 21, are based on the Tr set data 30 and the Td set data 31.

Specifically, the control device 7 controls the adjustment of the power supplied to the driver 85 from the high power source 81 and the low power source 83 so that the rise Tr and fall times Td of the test signal 21 output from the driver 85 are the set values.

Accordingly, the timing wave form and the high and low level potentials of the test signal 21 provided to the DUT 3 from the driver 85 are determined in the conventional manner. That is to say, the high level and the low level potentials of the test signal are determined by using the high level setting signal 22 and the low level setting signal 23.

Therefore, the rise and fall times Tr and Td of the test signal 21 pass through the Tr adjustment load circuit 82 and the Td adjustment load circuit 84 for amplifying the high and low level signals, and are determined by the power supplied to the driver 85.

The rise time Tr and the fall time Td of the test signal 21 are set, for example, as shown in the waveform diagrams of FIG. 4 to FIG. 7.

Figure 4:
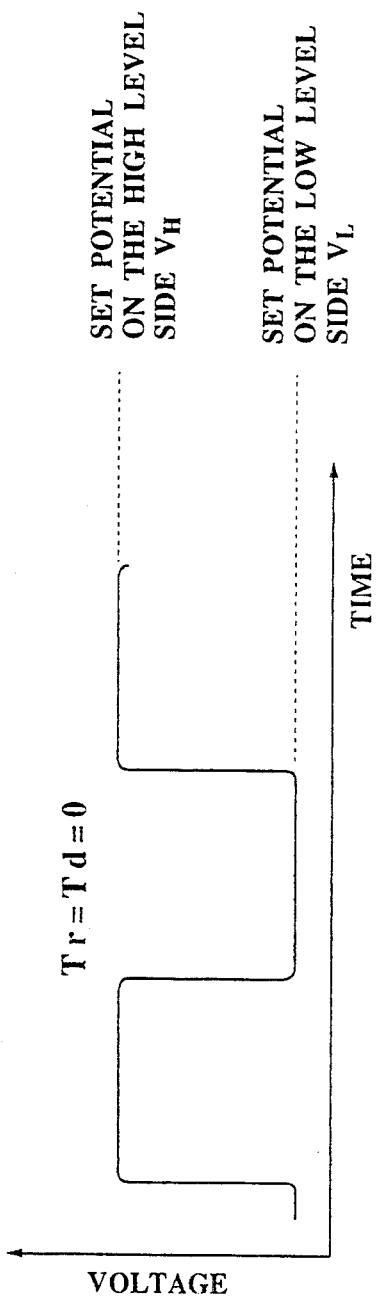
FIG. 4 shows a test signal in which the rise time Tr and the fall time Td are both set to "0" in the integrated circuit testing device shown in FIGS. 2 and 3.

FIG. 4 shows a test signal in which the rise time Tr and the fall time Td are both set to "0".

Figure 5:
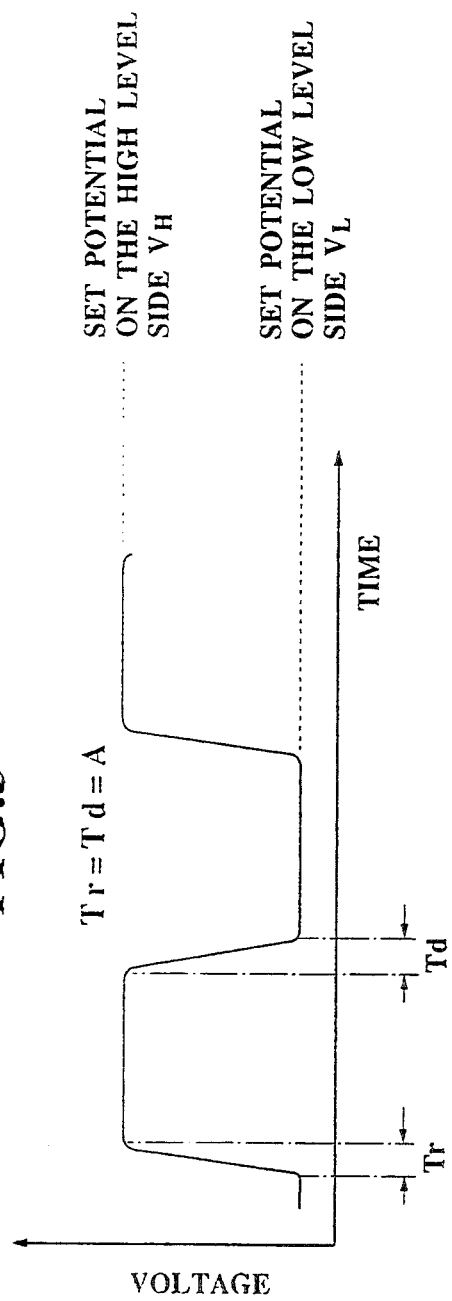
FIG. 5 shows a test signal in which the rise time Tr and the fall time Td are both set to "A" (where A is a real number) in the integrated circuit testing device shown in FIGS. 2 and 3.

FIG. 5 shows a test signal in which the rise time Tr and the fall time Td are both set to "A" (where A is a real number).

FIG. 6 shows a test signal which is set so that the relationship between the rise time Tr and the fall time Td is Tr>Td. Specifically, the rise time Tr is longer than the fall time Td.

FIG. 7 shows a test signal which is set so that the relationship between the rise time Tr and the fall time Td is Tr<Td.

Specifically, the rise time Tr is shorter than the fall time Td.

In this manner, the test signal is not influenced by the set potential on the high level side ($V_H$) or by the set potential on the low level side ($V_L$), and both the rise time Tr and the fall time Td can be independently and optionally varied and fed to the input pin of the DUT 3 from the driver 85.

Accordingly, the DUT 3 can be measured while the rise time Tr and the fall time Td of the signal input to the DUT 3 are being varied. As a result, in a CMOS circuit, for example, it is possible to evaluate the current consumed for the rise time Tr and the fall time Td of the input signal. It is also possible to evaluate the operating speed for the rise time Tr and the fall time Td of the input signal.

As can be understood from the foregoing explanation, because the rise and fall times can be varied in the test signal input to the integrated circuit under test, an integrated circuit testing device with improved testing capabilities can be provided in which the evaluation and testing can be performed In accordance with the rise and fall times of the test signal.

Various modifications will become known for those skilled in the art after the teaching of the present disclosure without departing from the scope thereof.

What is claimed is:

1. An integrated circuit testing device for testing a target circuit having an input terminal to receive a test signal, the testing device comprising:

small test signal generation means for generating a small test signal having a small amplification in accordance with test data provided from outside of the device;

control means for receiving set data from outside the device to set the rise time of the test signal and for receiving other set data from outside the device to set the fall time of the test signal, the control means providing rise time data and fall time data; and amplification means for receiving the small test signal transferred from the small test signal generating means, and the rise time data and the fall time data from the control means, and amplifying the small test signal to obtain a test signal having, a predetermined rise time and a predetermined fall time, and for supplying the test signal to the input terminal of the target circuit to be tested, wherein the amplification means further comprises load means in order to control the rise time and the fall time of the test signal in accordance with the rise time data and the fall time data provided from the control means.

2. An integrated circuit testing device according to claim 1, wherein the amplification means comprises:

a high power source means and a low power source means for setting the test signal data as the amplitude, the rise time, and the fall time of the test signal by receiving the rise time data and the fall time data from the control means; and a driver for providing the test signal in accordance with the small test signal transferred from the small test signal generation means and the test signal data;

the control means including:

a first adjustment signal generator for generating the fall time data in accordance with the set data; and a second adjustment signal generator for generating the rise time data in accordance with the set data.

3. The testing device of claim 1, in which the amplification means includes a high level amplification means for adjusting the peak amplitude of the test signal and a low level amplification means for adjusting the base amplitude of the test signal.

4. The testing device of claim 3, in which the rise time of the test signal is adjusted by a load circuit within the amplification circuit and the fall time of the test signal is adjusted by a further load circuit within the amplification circuit.

* * * * *